United States Patent [19]
Lee et al.

[11] Patent Number: 5,646,890
[45] Date of Patent: Jul. 8, 1997

[54] FLEXIBLE BYTE-ERASE FLASH MEMORY AND DECODER

[75] Inventors: Peter W. Lee, Saratoga, Calif.; Hsing-Ya Tsao; Fu-Chang Hsu, both of Taipei,, Taiwan

[73] Assignee: Aplus Integrated Circuits, Inc., Saratoga, Calif.

[21] Appl. No.: 624,322

[22] Filed: Mar. 29, 1996

[51] Int. Cl.$^6$ ................................................ G11C 16/00
[52] U.S. Cl. ................ 365/185.11; 365/185.29; 365/185.33; 365/218; 365/185.23
[58] Field of Search .............. 365/185.11, 185.29, 365/185.23, 185.33, 230.03, 230.06, 230.08, 189.05, 218

[56] References Cited

U.S. PATENT DOCUMENTS

| | | | |
|---|---|---|---|
| 4,698,787 | 10/1987 | Mukherjee et al. | 365/185 |
| 4,949,309 | 8/1990 | Rao | 365/218 |
| 5,097,444 | 3/1992 | Fong | 365/185 |
| 5,109,361 | 4/1992 | Yim et al. | 365/218 |
| 5,185,718 | 2/1993 | Rinerson et al. | 365/185 |
| 5,191,556 | 3/1993 | Radjy | 365/235 |
| 5,315,547 | 5/1994 | Skoji et al. | 365/218 |
| 5,337,281 | 8/1994 | Kobayashi et al. | 365/185.33 |
| 5,365,484 | 11/1994 | Cleveland et al. | 365/218 |
| 5,396,459 | 3/1995 | Arakawa | 365/185 |
| 5,396,468 | 3/1995 | Harari et al. | 365/218 |
| 5,491,656 | 2/1996 | Sawada | 365/185.18 |

*Primary Examiner*—Tan T. Nguyen
*Attorney, Agent, or Firm*—Flehr Hohbach Test Albritton & Herbert LLP

[57] ABSTRACT

A flexible word-erase flash memory includes a first bank of flash transistors forming a plurality of rows and a plurality of columns, where the gates of transistors in each row are coupled to common wordlines, the drains of transistors in each column are coupled to common bitlines and the sources of the transistors in the first bank are all coupled to a first sourceline. A second bank of flash transistors form a plurality of rows and a plurality of columns, where the gates of transistors in each row are coupled to common wordlines, the drains of transistors in each column are coupled to common bitlines and the sources of the transistors in the second bank are all coupled to a second sourceline. A wordline decoder is coupled to the wordlines and configured to receive a wordline address signal and to decode the wordline address signal to select a wordline. A bitline decoder is coupled to the bitlines and configured to receive a bitline address signal and to decode the bitline address signal to select a predetermined plurality of bitlines. A sourceline latch is coupled to the first sourceline and the second sourceline and configured to latch a selected sourceline to selectively provide a sourceline erase voltage on the selected sourceline. Advantages of the invention include reduced stress on transistors not selected to be erased. This reduces program time by selectively erasing only those transistors needing reprogramming and promotes longevity of the flash memory transistors by erasing only the selected transistors.

23 Claims, 5 Drawing Sheets

FLEXIBLE BYTE-ERASE FLASH MEMORY AND DECODER

FIELD

The present invention relates to a flexible byte-erase flash memory and decoder. In particular, the flash memory and decoder provide byte-selective read, program and erase features.

BACKGROUND

Most known flash memories are electrically erasable programmable read only memories (EEPROM) that support three operations: read, program and erase. Flash-type memories have a structure in which the edges of a source region and a drain region overlap a floating gate with a thin tunnel oxide layer therebetween. Flash memories are popular over traditional EEPROMs because the flash cell size is less than the EEPROM cell size, and flash memories are popular over EPROMs because the flash memory can be electrically erased without the need to expose the memory to UV light.

Flash memories are typically constructed as a NOR-plane array. When any of the transistors in the NOR-plane turns on, the drain current is changed on the bitline and a current sense amplifier detects the current change and converts the change to a data output. There are two erasing procedures for the NOR-plane flash memories. A first approach uses the voltages shown in Table 1 for erase, program and read. A flash EEPROM of this type is explained in Yim et at, U.S. Pat. No. 5,109,361.

TABLE 1

| mode | gate | source | drain |
|---|---|---|---|
| erase | VSS (ground) | VPPA (+13V) | float |
| program | VPP (+10V) | VSS (ground) | VPI (+5-7V) |
| read | VPI (+5V) | VSS (ground) | <VDD (<+1V) |

A second approach uses erase voltages shown in Table 2. The second approach uses identical voltages for program and read.

TABLE 2

| mode | gate | source | drain |
|---|---|---|---|
| erase | VNN (-10V) | VPI (+5V) | float |

The present invention can employ the voltage levels of either approach, but the detailed description gives an example using the voltages of the second approach.

In flash memories using the voltages of the first approach, a known flash memory provides the ability to erase the entire memory array or a large sector of approximately 128K bytes. Once the array is erased, it is re-programmed with the new data. The second approach provides an additional capability called a page-erase that can erase typically 512 or 128 bytes, which is smaller than in the first approach. Although the page-erase feature provides a much smaller erase size, it does not provide a high level of erase selectivity that is desired in order to promote fast operation.

A problem with known flash EEPROMs is that they have a slow operation because in order to write to the memory, an entire page of memory is erased and then programmed. This is true even if only a small portion is changed. As a result, the page-erase feature causes undue delays in changing the information in the flash memory and can cause delays in regaining access to the flash memory.

Additionally, there is a great desire to develop a flash memory having a long life. One problem with existing flash memories is low expected lifetime. Whenever an erase is performed on a flash transistor, the transistor is stressed, which reduces the life of the transistor. A result of the page-erase feature is that the erase operation stresses all the transistors in the page. Over time, the stress reduces the flash memory life. For example, it is very difficult to build a flash memory that can survive 10^6 write/erase cycles due to the erase and program stress on the flash memory cells. Therefore, a method of reducing stress in a flash memory is a very important development.

A goal of the invention is to overcome the identified problems and to provide a new technique to select a flexible-byte of flash cells to be erased. In an exemplary embodiment, the minimum erase size is one byte without sacrificing the array size. The invention provides that unnecessary write/erase cycles are not performed on the deselected cells. As a result, a the invention can provide a large number of operable write/erase cycles, such as 10^6 write/erase cycles, in a flash memory.

SUMMARY

The invention overcomes the identified problems and provides a flash memory and decoder that has fast operation and long life. An exemplary embodiment of a flexible word-erase flash memory includes a first bank of flash transistors forming a plurality of rows and a plurality of columns, where the gates of transistors in each row are coupled to common wordlines, the drains of transistors in each column are coupled to common bitlines and the sources of the transistors in the first bank are all coupled to a first sourceline. A second bank of flash transistors form a plurality of rows and a plurality of columns, where the gates of transistors in each row are coupled to common wordlines, the drains of transistors in each column are coupled to common bitlines and the sources of the transistors in the second bank are all coupled to a second sourceline. A wordline decoder is coupled to the wordlines and configured to receive a wordline address signal and to decode the wordline address signal to select a wordline. A bitline decoder is coupled to the bitlines and configured to receive a bitline address signal and to decode the bitline address signal to select a predetermined plurality of bitlines. A sourceline latch is coupled to the first sourceline and the second sourceline and configured to latch a selected sourceline to selectively provide a sourceline erase voltage on the selected sourceline.

Another embodiment of the invention a provides a wordline latch coupled to the wordlines and configured to latch a selected wordline to selectively provide a wordline erase voltage on the selected wordline.

The exemplary embodiments can be combined with a voltage pump generator. A voltage pump generator provides operational voltages that are derived from the supplied voltages. For example, if the memory is supplied with +3 V, and needs +10 V for a program function, the voltage pump generator creates the required voltage and provides it to the decoder circuits to accomplish the necessary function. Likewise, the voltage pump can provide a negative voltage to the decoder circuits for the erase function.

Advantages of the present invention include reduced erase/write cycle time and an improved expected lifetime of the flash memory due to reduced stress on the flash transistors within the flash memory.

BRIEF DESCRIPTION OF THE FIGURES

Additional advantages of the invention will become apparent upon reading the following detailed description and upon reference to the drawings, in which.

DETAILED DESCRIPTION

Exemplary embodiments are described with reference to specific configurations. Those skilled in the art will appreciate that various changes and modifications can be made while remaining within the scope of the claims. For example, the invention can be used with any type of NOR-plane array flash memory using Fowler-Nordheim (F-N) erase and channel high electron (CHE) programming. All electrical parameters are given by example and can be modified with good results.

HORIZONTAL FLEXIBLE BYTE-ERASE ARCHITECTURE

A first embodiment is described with reference to FIG. 1. A flash EEPROM memory 10 includes a plurality of banks 12a–j that store information. Each bank is constructed similar to a traditional flash transistor array, with rows and columns of flash transistors.

A wordline decoder 14 is coupled to each of the banks 12a–j. Wordline decoder 14 receives an address input X0–Xm and decodes the X0–Xm input to activate a wordline 15a–k. Ordinarily, wordline 15a–k includes a plurality of wordlines (WL0–WLk) where k is a 2 raised to the power m. That is, a design using 4 address lines X0–X3 will provide 16 wordlines WL0–WL15. When wordline decoder 14 is addressed by X0–Xm, a corresponding wordline WL0–WLk is activated.

A bitline decoder 16 is also coupled to each of the banks 12a–j. Bitline decoder 16 receives an address input Y0–Yn and decodes the Y0–Yn input to couple selected bitlines 18a–j from a selected bank to sense amplifier 20. Ordinarily, to the selected bitlines 18a–j include a plurality of bitlines (BL0–BLp) where p is a stored word that is usually 8 bits, 16 bits, 32 bits or other number of bits that represents a word to a processor. Moreover, there is also a number of bit control lines 17a–q that control the electrical signal coupling from selected bitlines 18a–j to sense amplifier 20 (explained below with reference to FIG. 2). When the selection is made, bitline decoder 16 coupled the selected bitlines to sense amplifier 20, which converts the sensed signal to data for output.

In the present invention, both wordline decoder 14 and bitline decoder 16 are provided with the operational voltages VNN, VSS, VDD, VPP and VPI. While the voltages can be applied as in the traditional flash memory shown in Table 1, the exemplary embodiments of the invention apply the voltages shown in Table 2.

Note that the program mode voltages and the read mode voltages are the same as those from Table 1. Similar to the prior techniques, the present invention performs the erase mode by providing an approximately 13 V differential between the gate and the source. While the erase voltages can be applied as in the traditional flash memory shown in Table 1, the exemplary embodiments of the invention employ a technique to achieve the approximately 13 V potential difference between the gate and the source by lowering the gate voltage to approximately VNN (–10 V) and rasing the source voltage to approximately VPI (+5 V), as shown in Table 2.

To facilitate the erase operation, a SL erase latch 22 is provided coupled to bitline decoder 16 via sourcelines 24a–j, one for each bank. Within each bank, the transistor gates are coupled to wordlines 15a–k, the drains are coupled to bitlines 18a–j, and the sources are coupled to sourcelines 24a–j. The operation of the flash memory is explained below, but we note that in the read mode or program mode, the read signal is activated and SL erase latch 22 is configured so that VSS (ground) is provided on sourcelines 24a–j.

Figure 2:
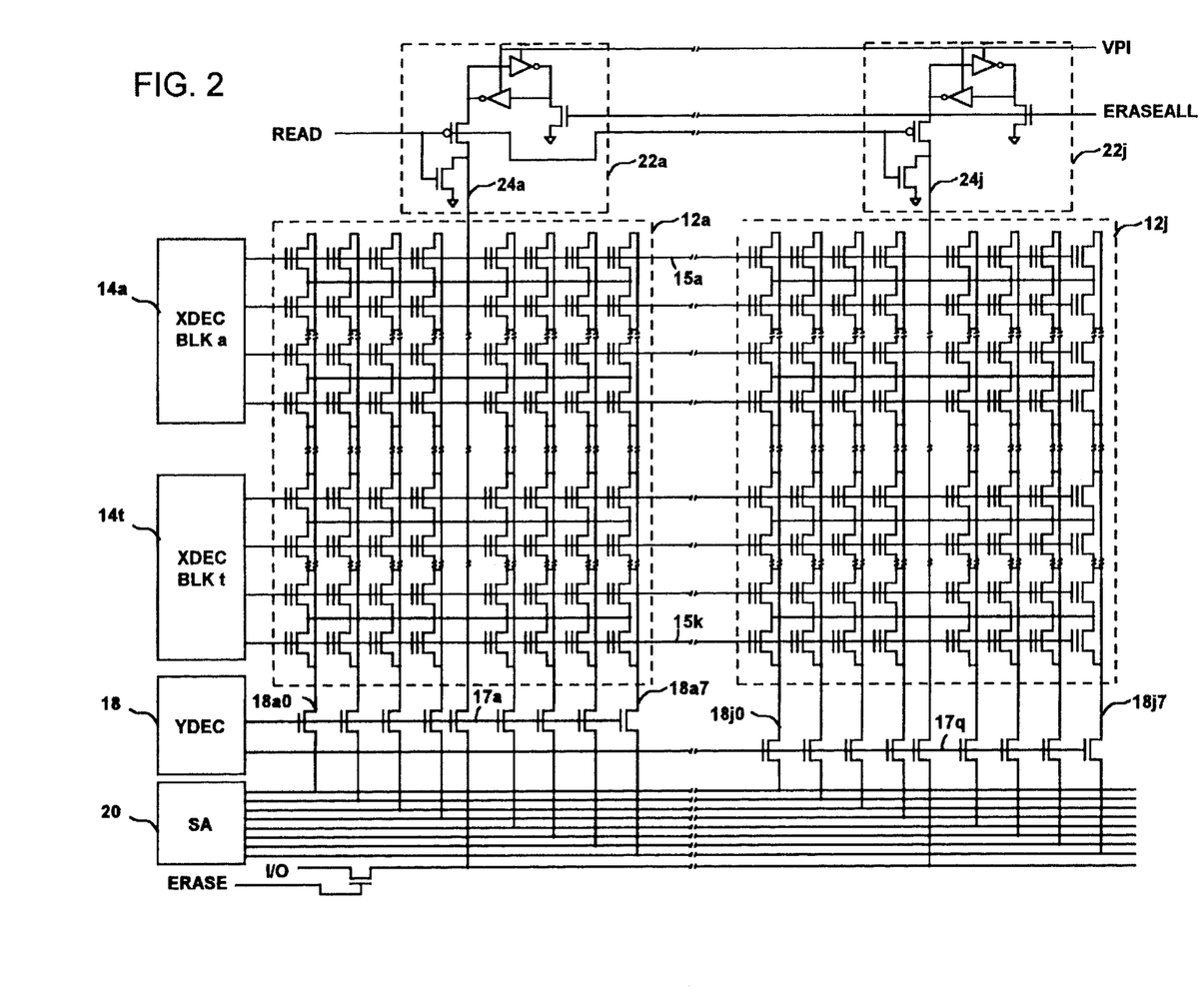
FIG. 2 depicts an implementation of a multi-bank flash EEPROM according to an embodiment of the invention.

FIG. 2 depicts an implementation of a multi-bank flash memory according to an embodiment of the invention. In this implementation, the flash transistors in the banks 12a–j are illustrated, bitline decoder 16 is illustrated and the latches 22a–j within SL erase latch 22 are illustrated. Each of latches 22a–j include a pair of inverters that provide the latch function and a p-channel and n-channel transistor. When the read signal is deactivated (set to VSS), the p-channel transistor is on which couples the sourceline to the par of inverters, and when the read signal is activated (set to VDD), the p-channel transistor is off and the n-channel transistor is on which couples the sourceline to VSS.

Note that bitline decoder 16 performs a coupling function depending on bank selection lines 17a–q and that bank selection lines 17a–q also control coupling of an erase input to sourcelines 24a–j. When an erase is requested, the erase signal is activated, a selection line is activated via bank selection lines 17a–q and a latch 22a–j is set in order to provide the VPI erase voltage to a selected bank. Further note that wordline decoder 14 is constructed from a plurality of wordline decoders 14a–t that are coupled to groups of wordlines 15a–k.

HORIZONTAL FLEXIBLE BYTE-ERASE PROCEDURE

Figure 1:
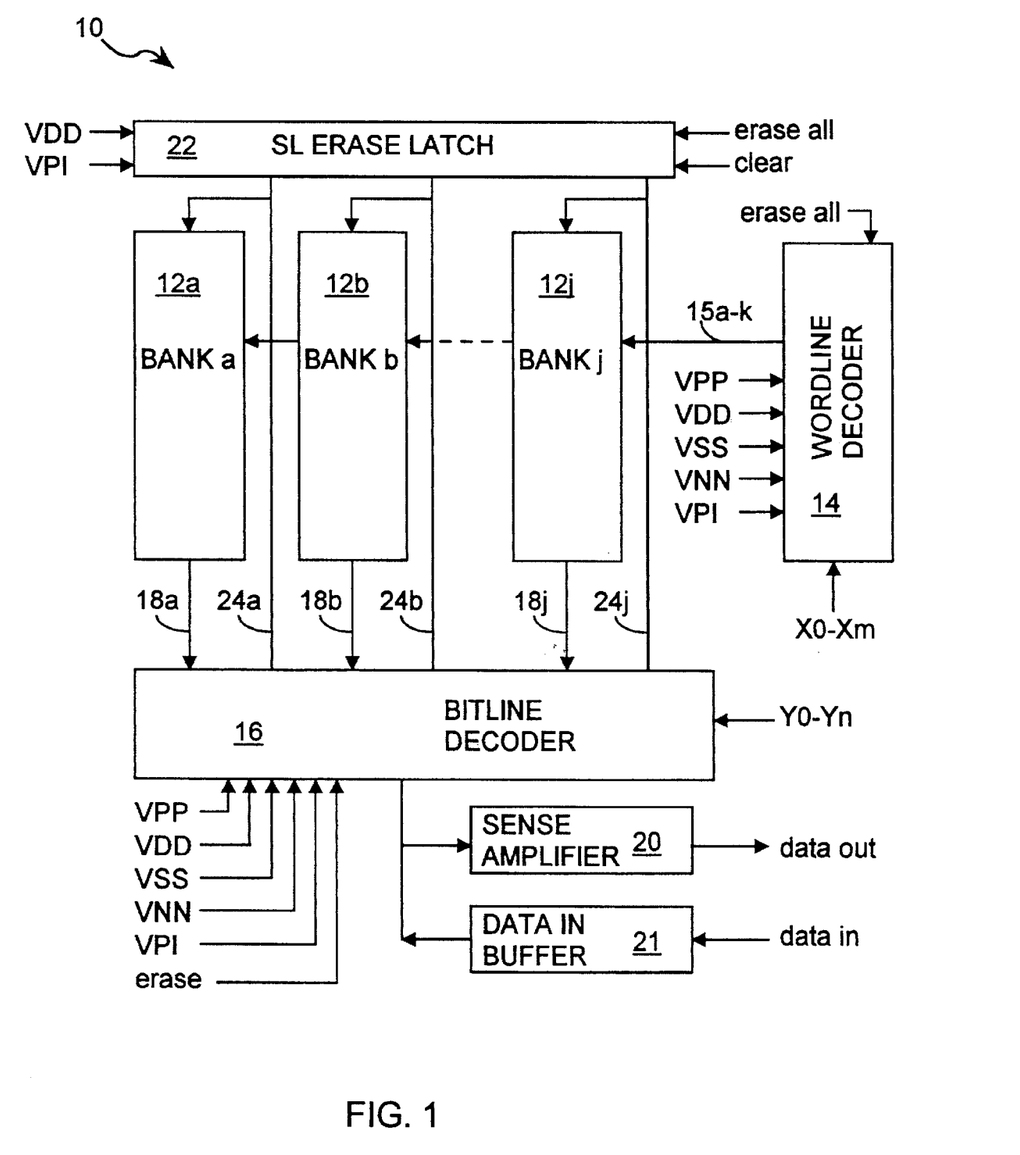
FIG. 1 depicts a multi-bank flash EEPROM according to an embodiment of the invention.

As shown by the architecture of FIG. 1 and 2, bitline decoder 16 can pass the erase signal to any sourceline 24a–j to set any SL latch 22a–j. Ordinarily, the SL erase latches are set with a voltage such as VDD (+3 V) and then a higher voltage is delivered to SL erase latch 22 to increase the voltage on the selected sourcelines. Thus, once a sourceline latch 22a–j is set, to erase one horizontal word in a bank (e.g. a byte), the SL latches are raised to VPI (+5 V) to bring the selected sourcelines up to VPI and the corresponding wordline 15a–k is lowered to VNN (–10 V). When this occurs, the selected word is erased.

Figure 3:
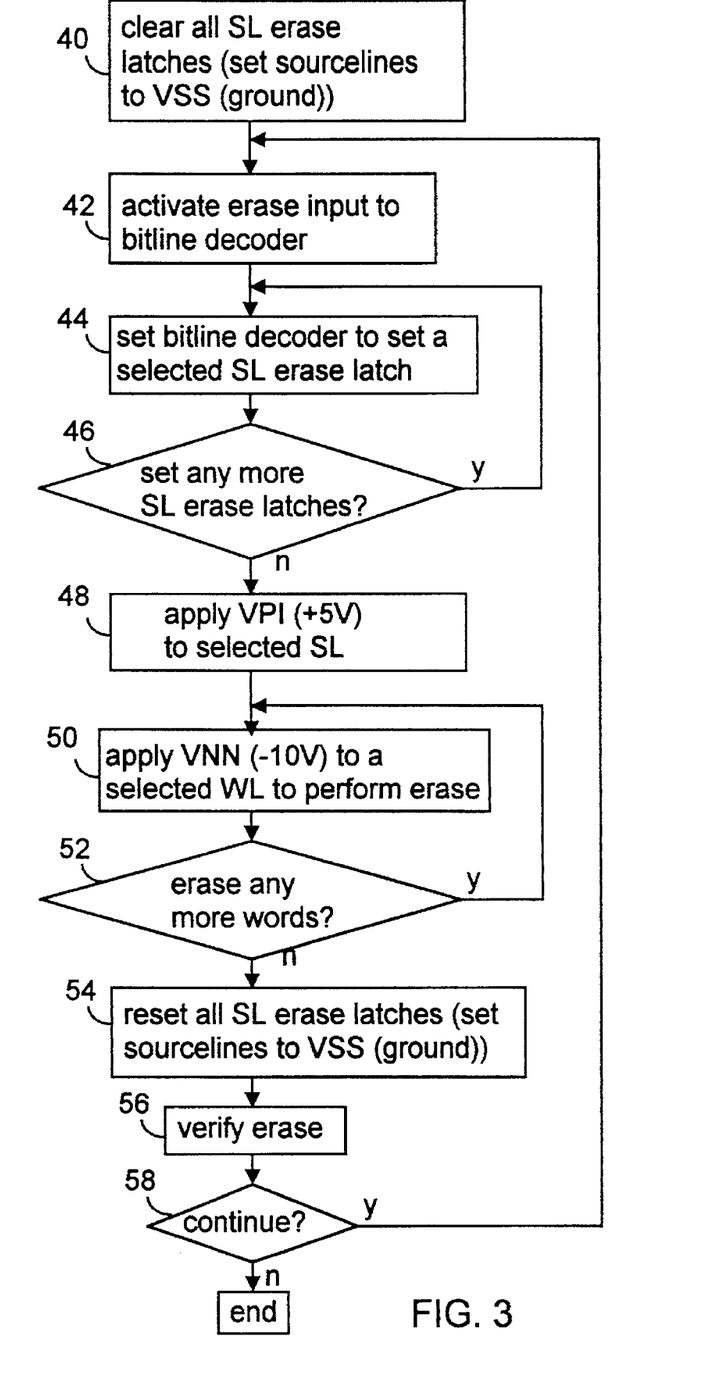
FIG. 3 is a flowchart showing a flexible byte-erase procedure performed on the flash EEPROM of FIG. 1.

Turning to the FIG. 3 flowchart, an explanation of a flexible byte-erase procedure is described. In step 40 all SL erase latches are initialized by clearing SL erase latch 22 and setting all the source lines 24a–j to VSS (ground). In step 42 the erase input to bitline decoder 16 is activated to set up a latch voltage such as VDD (+3 V) onto a bitline selected in the next step.

In step 44 each time that the bitline decoder activates a bank selection line 17a–q, VDD is passed via a selected sourceline 24a–j to set a selected latch 22a–j. For example, if bank selection line 17a is activated, VDD is placed on sourceline 24a, which sets latch 22a. Step 46 determines whether any additional latches 22a–j need to be set. If so, step 44 is again performed to set the selected latches 22a–j based on the bank selection lines 17a–q.

Once all the requested latches 22a–j are set, step 48 applies VPI (+5 V) to the selected SL 24a–j. Step 50 then applies VNN to a selected wordline 15a–k. This step erases the data stored in a selected bank located at a selected wordline. For example, when only latch 22a is set and only wordline 15a is selected, only one word is erased in bank 12a. However, when latches 22a and 22b are set and only wordline 15a is selected, one word from bank 12a is erased and one word from bank 12b is erased. If additional words are requested to be erased, additional wordlines 15a–k are selected and additional words are erased in selected banks. When no more words are to be erased, step 54 clears the SL erase latches 22a–j by activating the read signal, which sets all the source lines 24a–j to VSS.

Step 56 then verifies that the erase procedure was executed properly. This step can be performed by reading the erased cells to verify that they are erased. Step 58 determines whether additional erase steps are required. If so, step 58 returns the procedure to step 42 to again activate the erase input. If not, step 58 ends the erase procedure.

An example is given with reference to Table 3, for erasing 2 words in the third rows corresponding to wordlines 15c of banks 12a and 12c. Sourcelines 24a and 24c are latched at VPI and wordline 15c is set to VNN. As a result the words highlighted with an asterisk (*) are erased, in the third row and first and third columns (12a, 12c).

TABLE 3

|  | SL 24a | SL 24b | SL 24c | SL 24d |
| --- | --- | --- | --- | --- |
| WL0 (15a) VSS | VPI | VSS | VPI | VSS |
| WL1 (15b) VSS | VPI | VSS | VPI | VSS |
| WL2 (15c) VNN | VPI* | VSS | VPI* | VSS |
| WL3 (15d) VSS | VPI | VSS | VPI | VSS |
| WL4 (15e) VSS | VPI | VSS | VPI | VSS |

Once the selected erase is performed, a program step is performed to write to the flash memory in order to store information in selected locations.

VERTICAL FLEXIBLE BYTE-ERASE ARCHITECTURE

Figure 4:
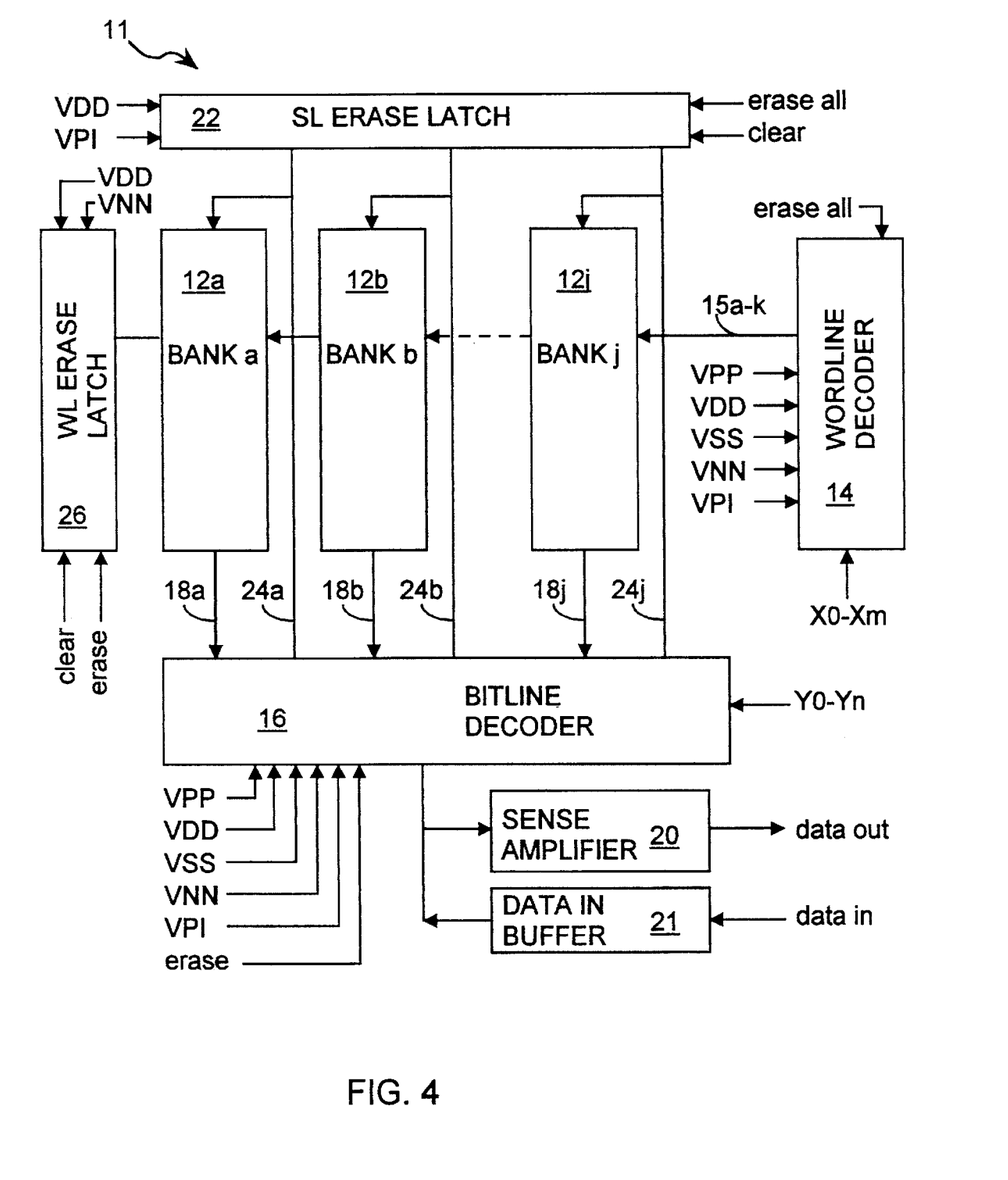
FIG. 4 depicts an implementation of a multi-bank flash EEPROM according to an embodiment of the invention.

FIG. 4 depicts a flash memory architecture that facilitates a vertical flexible erase function. This embodiment is similar to that of FIG. 1, and common reference numbers are used for common elements. The addition of a WL erase latch 26 performs a function similar to SL erase latch 22. In this configuration, however, WL erase latch 26 latches the selected wordlines and then applies VNN (−10 V) to the selected wordlines. When the read signal is activated, WL erase latch 26 resets and provides wordline decoder 14 with full independent control over wordlines 15a–k. In practice, WL erase latch includes a plurality of WL erase latches 26a–k corresponding to the plurality of wordlines 15a–k.

VERTICAL FLEXIBLE BYTE-ERASE PROCEDURE

Figure 5:
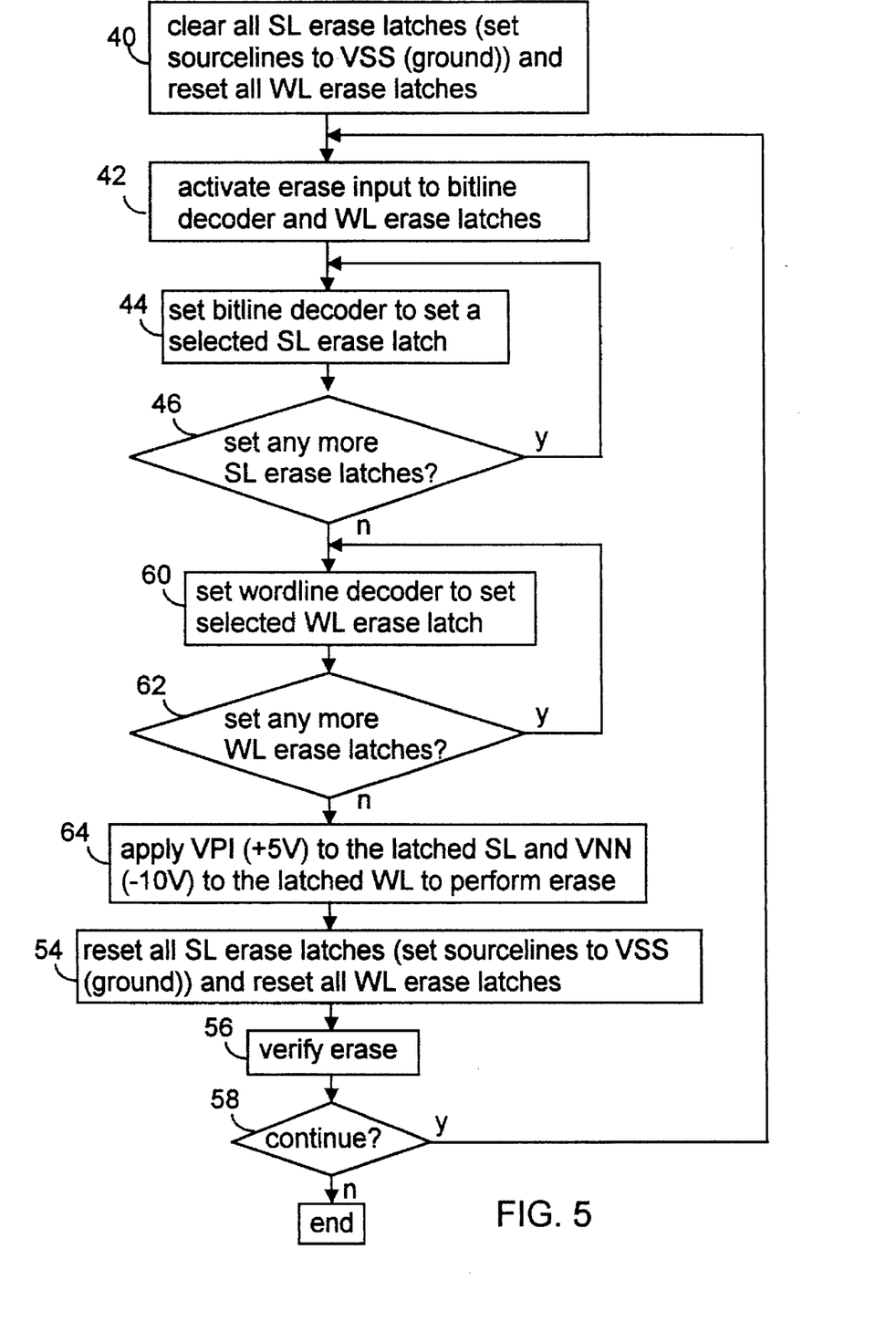
FIG. 5 is a flowchart showing a flexible byte-erase procedure performed on the flash EEPROM of FIG. 4.

Turning to the FIG. 5 flowchart, an explanation of a flexible byte-erase procedure is described. The flowchart in FIG. 5 is similar to that in FIG. 3 and common numbers are given to common steps. The additional steps performed in the present flowchart include step 60 which is performed by wordline decoder setting each selected wordline 15a–k to VDD (+3). This sets latches within WL erase latch 26 to hold the selected wordlines 15a–k. Step 62 determines whether any additional latches need to be set in WL erase latch 26. If so, step 54 is again performed to set the selected latches based on the selected wordlines 15a–k. Once all the requested latches in wordline erase latch 26 are set, step 64 applies the erase voltage to the selected sourcelines (VPI) and the erase voltage to the selected wordlines (VNN), and the selected words are erased. When no more words are to be erased, step 54 clears the SL erase latches 22a–j, which sets all the source lines 24a–j to VSS, and clears all the WL erase latches 26a–k, which returns independent control of wordlines 15a–k to wordline decoder 14.

An example is given with reference to Table 4, for erasing 4 words corresponding to wordlines 15a and 15c of banks 12a and 12c. Sourcelines 24a and 24c are latched at VPI and wordlines 15a and 15c are latched at VNN. As a result the words highlighted with an asterisk (*) are erased, in the first and third row (15a, 15c) and first and third columns (12a, 12c).

TABLE 4

|  | SL 24a | SL 24b | SL 24c | SL 24d |
| --- | --- | --- | --- | --- |
| WL0 (15a) VNN | VPI* | VSS | VPI* | VSS |
| WL1 (15b) VSS | VPI | VSS | VPI | VSS |
| WL2 (15c) VNN | VPI* | VSS | VPI* | VSS |
| WL3 (15d) VSS | VPI | VSS | VPI | VSS |
| WL4 (15e) VSS | VPI | VSS | VPI | VSS |

Once the selected erase is performed, a program step is performed to write to the flash memory in order to store information in selected locations.

VOLTAGE AND CURRENT PUMPS

The disclosed embodiments assume that any necessary power level is supplied. However, the disclosed embodiments can be combined with a charge or voltage pump generator to increase the voltage beyond that supplied, i.e. from VDD to VPP. Charge and voltage pumps are known in the art and example is given by way of reference to U.S. Pat. Nos. 4,679,134 and 4,812,961. The incorporation of a pump generator with the exemplary embodiments expands the operational voltages in order to facilitate improved yield and reliable retrieval of stored values.

For example, if the memory is supplied with VDD(+3.3 V), and needs VPP(+10 V) for a program function, the voltage pump generator creates the needed voltage and provides it to the decoder circuits to accomplish the necessary function. Likewise, the voltage pump can provide a negative voltage VNN(−10 V) to the decoder circuits for the erase function.

CONCLUSION

The invention provides many advantages over known techniques. The invention reduces program time. In a typical flash memory, the entire array is erased and re-programmed, which is a time-consuming procedure. Even when a page-erase feature is provided, the entire page is erased and re-programmed, which is also time-consuming. The invention provides a fast and convenient way to erase only those bytes that need to be re-programmed. The invention reduces time and provides improves processor access to the flash memory. Additionally, the invention reduces power consumption by using power only when a byte-erase and re-program are required. This is an important advantage for portable electronics.

The invention also improves the longevity of the flash memory. Since only the bytes that require re-programming are erased, stress on the flash memory cells is reduced. In the exemplary embodiments, the minimum erase size is one byte without sacrificing the array size. The invention provides that unnecessary write/erase cycles are not performed on the deselected cells. As a result, a the invention can provide a large number of operable write/erase cycles, such as 10^6 write/erase cycles, in a flash memory. Finally, flash memories incorporating the invention can be constructed using any size array such as a 16×32, 1K×1K, 1K×2K, or N×M array.

Having disclosed exemplary embodiments and the best mode, modifications and variations may be made to the disclosed embodiments while remaining within the scope of the invention as defined by the following claims.

What is claimed is:

1. A flexible word-erase flash memory comprising:
   a first bank of flash transistors forming a plurality of rows and a plurality of columns, each transistor having a gate, drain and source, where the gates of transistors in each row are coupled to common wordlines, the drains of transistors in each column are coupled to common bitlines and the sources of the transistors in the first bank are all coupled to a first sourceline;
   a second bank of flash transistors forming a plurality of rows and a plurality of columns, each transistor having a gate, drain and source, where the gates of transistors in each row are coupled to common wordlines, the drains of transistors in each column are coupled to common bitlines and the sources of the transistors in the second bank are all coupled to a second sourceline;
   a wordline decoder coupled to said wordlines and configured to receive a wordline address signal and to decode said wordline address signal to select a wordline;
   a bitline decoder coupled to said bitlines and configured to receive a bitline address signal and to decode said bitline address signal to select a predetermined plurality of bitlines; and
   a sourceline latch coupled to said first sourceline and said second sourceline and configured to latch a selected sourceline to selectively provide a sourceline erase voltage on said selected sourceline.

2. The flexible word-erase flash memory of claim 1, wherein:
   said wordline decoder is configured to provide a wordline erase voltage on a selected wordline in response to an erase signal, said bitline decoder is configured to float selected bitlines in response to said erase signal, and said sourceline latch is configured to provide said sourceline erase voltage on said selected sourceline in response to said erase signal.

3. The flexible word-erase flash memory of claim 2, wherein:
   said sourceline latch is configured to reset in response to a read signal.

4. The flexible word-erase flash memory of claim 2, wherein:
   said wordline decoder is configured to provide a wordline erase voltage on all wordlines in response to an erase all signal, said bitline decoder is configured to float all bitlines in response to said erase all signal, and said sourceline latch is configured to provide said sourceline erase voltage on all sourcelines in response to said erase all signal.

5. The flexible word-erase flash memory of claim 2, wherein:
   said sourceline latch is configured to reset in response to a read signal, and said wordline latch is configured to reset in response to a read signal.

6. The flexible word-erase flash memory of claim 1, further comprising:
   a wordline latch coupled to said wordlines and configured to latch a selected wordline to selectively provide a wordline erase voltage on said selected wordline.

7. The flexible word-erase flash memory of claim 6, wherein:
   said wordline latch is configured to provide a wordline erase voltage on said selected wordline in response to an erase signal, said bitline decoder is configured to float selected bitlines in response to said erase signal, and said sourceline latch is configured to provide said sourceline erase voltage on said selected sourceline in response to said erase signal.

8. The flexible word-erase flash memory of claim 6, wherein:
   said wordline latch is configured to provide a wordline erase voltage on all wordlines in response to an erase all signal, said bitline decoder is configured to selectively float all bitlines in response to said erase all signal, and said sourceline latch is configured to provide said sourceline erase voltage on all sourcelines in response to said erase all signal.

9. A flexible word-erase flash memory comprising:
   a first bank of flash transistors forming a plurality of rows and a plurality of columns, each transistor having a gate, drain and source, where the gates of transistors in each row are coupled to common wordlines, the drains of transistors in each column are coupled to common bitlines and the sources of the transistors in the first bank are all coupled to a first sourceline;
   a second bank of flash transistors forming a plurality of rows and a plurality of columns, each transistor having a gate, drain and source, where the gates of transistors in each row are coupled to common wordlines, the drains of transistors in each column are coupled to common bitlines and the sources of the transistors in the second bank are all coupled to a second sourceline;
   a wordline decoder coupled to said wordlines and configured to receive a wordline address signal and to decode said wordline address signal to select a wordline;
   a bitline decoder coupled to said bitlines and configured to receive a bitline address signal and to decode said bitline address signal to select a predetermined plurality of bitlines; and
   a wordline latch coupled to said wordlines and configured to latch a selected wordline to selectively provide a wordline erase voltage on said selected wordline.

10. The flexible word-erase flash memory of claim 9, wherein:
    said wordline latch is configured to provide said wordline erase voltage on said selected wordline in response to an erase signal, said bitline decoder is configured to float selected bitlines in response to said erase signal, and said bitline decoder is configured to provide a sourceline erase voltage on a selected sourceline in response to said erase signal.

11. The flexible word-erase flash memory of claim 10, wherein:
    said wordline latch is configured to reset in response to a read signal.

12. The flexible word-erase flash memory of claim 10, wherein:
    said wordline latch is configured to provide a wordline erase voltage on all wordlines in response to an erase all signal, said bitline decoder is configured to float all bitlines in response to said erase all signal, and said bitline decoder is configured to provide a sourceline erase voltage on all sourcelines in response to said erase all signal.

13. A method of providing a flexible word-erase in a flash memory having a first bank of flash transistors with a first sourceline, and a second bank of flash transistors with a second sourceline, said method comprising the steps of:

receiving an address of a word requested to be erased;

decoding said address to identify a word in one of said first bank and said second bank;

latching a sourceline corresponding to said identified word in one of said first bank and said second bank; and in response to an erase signal, performing the steps of:

(a) providing a wordline erase voltage to gates of transistors for said identified word;

(b) floating bitlines to drains of said transistors for said identified word; and (c) providing a sourceline erase voltage to said latched sourceline.

14. The method of claim 13, further comprising the step of:

in response to a read signal, resetting said latched sourceline.

15. The method of claim 13, further comprising the step of:

in response to an erase all signal, performing the steps of:

(a) providing a word fine erase voltage to gates of all transistors;

(b) floating bitlines to drains of all transistors; and (c) providing a sourceline erase voltage to all sourcelines.

16. The method of claim 13 where said flash memory further has a third bank of flash transistors with a third sourceline, said method further comprising the steps of:

receiving a second address of a second word requested to be erased;

decoding said second address to identify a second word in one of said second bank and said third bank;

latching a second sourceline corresponding to said second identified word in one of said second bank and said third bank; and in response to said erase signal, performing the steps of:

(a) providing a wordline erase voltage to gates of transistors for said second identified word;

(b) floating bitlines to drains of said transistors for said second identified word; and (c) providing a sourceline erase voltage to said second latched sourceline.

17. The method of claim 16, further comprising the steps of:

latching a wordline corresponding to said identified word in one of said first bank and said second bank; and latching a second wordline corresponding to said second identified word in one of said second bank and said third bank.

18. The method of claim 17, further comprising the step of:

in response to a read signal, resetting said latched sourcelines and resetting said latched wordlines.

19. A method of providing a flexible word-erase in a flash memory having a first bank of flash transistors with a first sourceline, and a second bank of flash transistors with a second sourceline, said method comprising the steps of:

receiving an address of a word requested to be erased;

decoding said address to identify a word in one of said first bank and said second bank;

latching a wordline corresponding to said identified word in one of said first bank and said second bank; and in response to an erase signal, performing the steps of:

(a) providing a wordline erase voltage to gates of transistors for said latched wordline;

(b) floating bitlines to drains of said transistors for said identified word; and (c) providing a sourceline erase voltage to a sourceline for said identified word.

20. The method of claim 19, further comprising the step of:

in response to a read signal, resetting said latched wordline.

21. The method of claim 19, further comprising the step of:

in response to an erase all signal, performing the steps of:

(a) providing a wordline erase voltage to gates of all transistors;

(b) floating bitlines to drains of all transistors; and (c) providing a sourceline erase voltage to all sourcelines.

22. A flexible word-erase flash memory comprising:

a first bank of flash transistors forming a plurality of rows and a plurality of columns, each transistor having a gate, drain and source, where the gates of transistors in each row are coupled to common wordlines, the drains of transistors in each column are coupled to common bitlines and the sources of the transistors in the first bank are all coupled to a first sourceline;

a second bank of flash transistors forming a plurality of rows and a plurality of columns, each transistor having a gate, drain and source, where the gates of transistors in each row are coupled to common wordlines, the drains of transistors in each column are coupled to common bitlines and the sources of the transistors in the second bank are all coupled to a second sourceline;

a wordline decoder coupled to said wordlines and configured to receive a wordline address signal and to decode said wordline address signal to select a wordline;

a bitline decoder coupled to said bitlines and configured to receive a bitline address signal and to decode said bitline address signal to select a predetermined plurality of bitlines; and a latch including at least one of the following:

a sourceline latch coupled to said first sourceline and said second sourceline and configured to latch a selected sourceline to selectively provide a sourceline erase voltage on said selected sourceline; and a wordline latch coupled to said wordlines and configured to latch a selected wordline to selectively provide a wordline erase voltage on said selected wordline.

23. A method of providing a flexible word-erase in a flash memory having a first bank of flash transistors with a first sourceline, and a second bank of flash transistors with a second sourceline, said method comprising the steps of:

receiving an address of a word requested to be erased;

decoding said address to identify a word in one of said first bank and said second bank; and a latching step including at least one of the following steps (A) and (B):

(A) latching a sourceline corresponding to said identified word in one of said first bank and said second bank; and
in response to an erase signal, performing the steps of:
  (a) providing a wordline erase voltage to gates of transistors for said identified word;
  (b) floating bitlines to drains of said transistors for said identified word; and
  (c) providing a sourceline erase voltage to said latched sourceline; and
(B) latching a wordline corresponding to said identified word in one of said first bank and said second bank; and in response to an erase signal, performing the steps of:
  (a) providing a wordline erase voltage to gates of transistors for said latched wordline;
  (b) floating bitlines to drains of said transistors for said identified word; and
  (c) providing a sourceline erase voltage to a sourceline for said identified word.

* * * * *